(12) United States Patent
Mizoguchi et al.

(10) Patent No.: US 6,646,931 B2
(45) Date of Patent: Nov. 11, 2003

(54) LIFE WARNING GENERATION SYSTEM AND METHOD OF SEMICONDUCTOR STORAGE DEVICE EQUIPPED WITH FLASH MEMORY

(75) Inventors: Shinichi Mizoguchi, Tokyo (JP); Masatoshi Kimura, Tokyo (JP); Takayuki Shinohara, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/096,486

(22) Filed: Mar. 13, 2002

(65) Prior Publication Data

US 2003/0002366 A1 Jan. 2, 2003

(30) Foreign Application Priority Data

Jun. 27, 2001 (JP) ........................ 2001-194927
Oct. 5, 2001 (JP) ........................ 2001-310120

(51) Int. Cl.$^7$ ................................ G11C 7/00
(52) U.S. Cl. .................. 365/200; 365/185.09
(58) Field of Search ............................ 365/200, 185.09

(56) References Cited

U.S. PATENT DOCUMENTS 5,428,569 A  6/1995  Kato et al. .................. 365/185
5,515,500 A * 5/1996  Mizuno et al. ......... 395/182.05
6,073,209 A * 6/2000  Bergsten ..................... 711/114
6,105,146 A * 8/2000  Tavallaei et al. ............... 714/2

FOREIGN PATENT DOCUMENTS

JP  2-66797   3/1990
JP  6-28899   2/1994
JP  11-260071 9/1999

OTHER PUBLICATIONS

Betty Prince, "Semicondutor Memories", 1983, Wiley, 2$^{nd}$ edition, pp. 586–587.*

* cited by examiner

Primary Examiner—M. Tran
(74) Attorney, Agent, or Firm—McDermott, Will & Emery

(57) ABSTRACT

A semiconductor storage device is equipped with flash memories each flash memory has a limited size of spare storage area for rewriting data when a write error occurs, and the storage device calculates the remaining size of the spare storage area after the completion of the re-writing, and examines whether or not the remaining size is smaller than a predetermined value, and generates a warning when the remaining size is smaller than the predetermined value, to thereby acknowledge that the life of each flash memory comes close to the end before completely used up.

13 Claims, 13 Drawing Sheets

Fig.12

PARAMETERS IN EACH REGISTER BEFORE AND AFTER EXECUTION OF COUNT REPLACE SECTOR COMMAND AND THEIR DESCRIPTION

| ATA Task Registers | Byte Offset | Count Replace Sectors Command in Execution | | | | | | | |
|---|---|---|---|---|---|---|---|---|---|
| | | 7 | 6 | 5 | 4 | 3 | 2 | 1 | 0 |
| Command | 7 | F0h | | | | | | | |
| Drive/Head | 6 | X | X | X | DRV | X | | | |
| Cylinder High | 5 | X | | | | | | | |
| Cylinder Low | 4 | X | | | | | | | |
| Sector Number | 3 | X | | | | | | | |
| Sector Count | 2 | X | | | | | | | |
| Featuers | 1 | X | | | | | | | |

| ATA Task Register | Byte Offset | Count Replace Sectors Command After Execution | | | | | | | |
|---|---|---|---|---|---|---|---|---|---|
| | | 7 | 6 | 5 | 4 | 3 | 2 | 1 | 0 |
| Status | 7 | BSY | DRDY | DWF | DSC | DRQ | CORR | IDX | ERR |
| | | 0 | 1 | 0 | 1 | 0 | 0 | 0 | V |
| Drive/Head | 6 | X | X | X | DRV | X | | | |
| Cylinder High | 5 | X | | | | | | | |
| Cylinder Low | 4 | X | | | | | | | |
| Sector Number | 3 | X | | | | | | | |
| Sector Count | 2 | Rep Sec Count | | | | | | | |
| Error | 1 | BBK | UNC | MC | IDNF | MCR | ABRT | TK0NE | AMNF |
| | | 0 | 0 | 0 | 0 | 0 | V | 0 | V |

| Symbols | Description |
|---|---|
| DRV | Drive Number |
| ERR | This is Set By Card When Command Error Occurs |
| Rep Sec Count | The Remaining Number Of Good Sections is Set As Spare Sectors. When The Remaining Number is 255 Or More, This is FFh. Otherwise, This is Set With The Remaining Number |
| ABRT | When Command is Not Accepted, This is Set By Card |
| AMNF | When Command is Hardly Executed, This is Set By Card |

Fig.13

PARAMETERS IN EACH REGISTER BEFORE AND AFTER EXECUTION OF COUNT REPLACE CONDITION COMMAND

| ATA Task Registers | Byte Offset | Check Replace Condition Command In Execution | | | | | | | |
|---|---|---|---|---|---|---|---|---|---|
| | | 7 | 6 | 5 | 4 | 3 | 2 | 1 | 0 |
| Command | 7 | F0h | | | | | | | |
| Drive/Head | 6 | X | X | X | DRV | X | | | |
| Cylinder High | 5 | X | | | | | | | |
| Cylinder Low | 4 | X | | | | | | | |
| Sector Number | 3 | X | | | | | | | |
| Sector Count | 2 | X | | | | | | | |
| Featuers | 1 | X | | | | | | | |

| ATA Task Register | Byte Offset | Check Replace Condition Command After Execution | | | | | | | |
|---|---|---|---|---|---|---|---|---|---|
| | | 7 | 6 | 5 | 4 | 3 | 2 | 1 | 0 |
| Status | 7 | BSY | DRDY | DWF | DSC | DRQ | CORR | IDX | ERR |
| | | 0 | 1 | 0 | 1 | 0 | 0 | 0 | V |
| Drive/Head | 6 | X | X | X | DRV | X | | | |
| Cylinder High | 5 | X | | | | | | | |
| Cylinder Low | 4 | X | | | | | | | |
| Sector Number | 3 | X | | | | | | | |
| Sector Count | 2 | Rep Code (00h, 0Fh, FFh) | | | | | | | |
| Error | 1 | BBK | UNC | MC | IDNF | MCR | ABRT | TK0NF | AMNF |
| | | 0 | 0 | 0 | 0 | 0 | V | 0 | V |

| Symbols | Description |
|---|---|
| DRV | Drive Number |
| ERR | This is Set By Card When Command Error Occurs |
| Rep Code | This is Set With Following Codes Indicative Of The Remaining Of Spare Sectors.<br>00h: When The Remaining is 50% Or More Of The Initial Spare Area<br>0Fh: When The Remaining is Smaller Than 50% But Not Smaller Than 10% Of The Initial Spare Area<br>FFh: When The Remaining is Smaller Than 10% Of The Initial Spare Area |
| ABRT | When Command is Not Accepted, This is Set By Card |
| AMNF | When Command is Hardly Executed, This is Set By Card |

LIFE WARNING GENERATION SYSTEM AND METHOD OF SEMICONDUCTOR STORAGE DEVICE EQUIPPED WITH FLASH MEMORY

BACKGROUND OF THE INVENTION

1. Field of the Invention

The present invention relates to a semiconductor storage device such as a semiconductor card, equipped with flash memories of which the number of rewriting actions is limited, and particularly to a semiconductor storage device having spare sectors for replacing error sectors in rewriting data and arranged to give a warning when the number of rewriting actions is close to its limit.

2. Description of the Prior Art

Recently, as semiconductor storage devices such as semiconductor cards using flash memories have been increased in storage capacity scale, they are now used as data storage devices in mobile terminals such as portable information apparatuses (PDAs) or factory automation system (referred to as "FA", hereinafter). In particular, FA system requires a higher level of environmental durability and commonly employs a hard disk drive. Recently, many FA systems utilize semiconductor cards which have much higher environmental durability.

For example, a flash ATAPC card, compact flash (registered trademark) card and flash drive are used as the semiconductor storage device for a substitute for a hard disk drive in various applications. These examples include non-volatile or flash memories built therein, each memory having a floating gate structure of memory cells and capable of writing and reading data with protocols compatible with a hard disk drive.

A flash memory has a floating gate structure where the number of rewriting actions is limited. It is hence schemed for increasing the operating life of the flash memory to prepare and use spare sectors (blocks) for replacing error sectors (blocks) of which the number of rewriting actions is exhausted. Accordingly, as each flash memory is increased in the number of rewriting actions more than that of rewritable actions per sector (block), it can favorably be used in a semiconductor storage device.

However, when all the spare sectors (blocks) are used up and another error sector (block) is generated in the rewriting, the semiconductor storage device fails to replace the error sector (block) with a spare one and will thus be defective due to causing a rewriting error.

Such a conventional semiconductor storage device having a flash memory includes no means for notifying a host apparatus of the exhaustion condition of the spare sectors (blocks). This results in that the operating life of the conventional semiconductor storage device is identified only at the time when a rewriting error suddenly occurs during a continuous operation.

FIG. 8 is a block diagram showing a conventional semiconductor card as a semiconductor storage device equipped with flash memories. As shown in the figure, the semiconductor card 82 comprises a card controller 83, flash memories 84, and a power supply circuit 86. The card controller 83 includes a CPU 85, a buffer portion 88, and an error correction coding circuit 89 (referred to as "ECC circuit", hereinafter). The card controller 83 is linked with an oscillator 87. The card controller 83 executes data transmission to and from an external system 81 of various data signals including I/O signals, address signals, and control signals.

The operation of the conventional semiconductor card will now be explained in brief. When acknowledging a message of a command received from the external system 81, the card controller 83 starts control actions for implementation of the command. The control actions of the card controller 83 are basically programmed and executed by the CPU 85 provided in the card controller 83. The read and write actions on the flash memories 84 are based on data transfer via the buffer portion 88 built in the card controller 83.

Generally, as each flash memory has a limited life in rewriting defective sectors, the semiconductor card prepares spare storage areas for prolonging the life of rewriting actions. The spare storage areas of the semiconductor card have specific rewritable size at each replacement action and entire replacement storage size, which are individually determined and managed depending on the type of equipped flash memories and the controlling method.

The conventional semiconductor card is designed to notify the external system 81 of the occurrence of error only when the spare storage areas have been used up and a counteraction is needed, but not give an early warning to the system 81 before the spare storage areas are exhausted. In other words, exhaustion of the spare storage areas is not known before the occurrence of error is notified. Therefore, the degree of the used spare storage areas is hardly examined, which results in that the rewriting action may exceed the rewritable limit without precaution. This disables the function of the flash memories and causes the semiconductor card to have an erratic action.

When the conventional flash memory provided in the semiconductor card is used in an FA system, the end of the rewriting life of the flash memories may suddenly cause an error, which hence results in functional faults of the system such as a sudden stop of the system line. It is thus urgently necessary to provide a method of warning that the life of the semiconductor card in storage capacity thereof comes close to its end or limit.

SUMMARY OF THE INVENTION

The present invention has been developed for eliminating the foregoing drawbacks and its object is to provide a system and a method of generating a warning signal in a semiconductor card equipped with a set of flash memories which is arranged for examining a remaining size of a spare storage area in rewriting actions to judge that the life of each flash memory comes close to its end before the flash memory is completely used up, thus preventing any malfunction derived from careless use after the end of the life.

It is another object of the present invention to provide a semiconductor storage device having flash memories capable of rewriting data in sector (block) units, employing a command for examining consumption of spare sectors (blocks) and the storage device is arranged for, when receiving the command from an external system such as a host apparatus, notifying the host apparatus of the consumption of spare sectors (blocks) that the number of spare sectors (blocks) comes close to its end. Namely, the time for replacement of the semiconductor device with a new device is notified before any fault resulting in malfunction occurs in the system.

For achievement of the above objects, a first aspect of the present invention provides a semiconductor storage device equipped with flash memories each having a limited size of a spare storage area, which comprises: an error decision unit for judging whether or not an error occurs during writing of data; a replacing unit for rewriting data to the spare storage area when the error decision unit judges that an error occurs; a spare area size calculating unit for calculating a remaining size of the spare storage area after the data has been re-written to the spare storage area; a spare area checking unit for comparing the remaining size of the spare storage area with a predetermined value; and a warning generator for generating a warning when the remaining size of the spare storage area is smaller than the predetermined value.

In this arrangement, the replacing unit may acquire a start address of the spare storage area from a spare storage area management table which is saved in a management area of each flash memory to thereby rewrite the data to the spare storage area of the acquired address, and after the completion of the data rewriting, the replacing unit updates the spare storage area management table and a logic-to-physic conversion table saved in the management area.

A second aspect of the present invention provides a warning generating system of a semiconductor storage device exchanging commands and data with an external system, the semiconductor storage device being equipped with flash memories each having a limited size of a spare storage area, where the system comprises: an error decision unit for judging whether or not an error occurs during writing of data; a replacing unit for rewriting data to the spare storage area when the error decision unit judges that an error occurs; a spare area size calculating unit for calculating a remaining size of the spare storage area after the data has been re-written to the spare storage area; a spare area checking unit for comparing the remaining size of the spare storage area with a predetermined value; and a warning generator for generating a warning when the remaining size of the spare storage area is smaller than the predetermined value.

A third aspect of the present invention provides a warning generating method of a semiconductor storage device equipped with flash memories each having a limited size of a spare storage area, where the method comprising the steps of: judging whether or not an error occurs during writing of data; rewriting data to the spare storage area when it is judged that an error occurs; calculating a remaining size of the spare storage area after the data has been rewritten to the spare storage area; comparing the remaining size of the spare storage area with a predetermined value; and generating a warning when the remaining size of the spare storage area is smaller than the predetermined value.

By the arrangements set forth in the first to third aspects of the present invention, when an error occurs during the writing of the data on the flash memory in the semiconductor storage device, after the data is rewritten to the spare storage area, the remaining size of the spare storage area is examined, and when the remaining size is smaller than the predetermined value, a warning is generated from a warning generating unit. As a result, the user of the semiconductor storage device such as a semiconductor card can timely be notified of the fact that the life of the device comes close to its end.

The spare area size calculating unit may calculate the remaining size of the spare storage area in response to a check command for checking the remaining size of the spare storage area which is issued by an external system. Thus, it is decided whether or not a warning be raised only when the external system requests for the examination of the remaining size, and accordingly, the warning can effectively given to a user.

The semiconductor storage device may further comprise a register for flagging a specific bit indicative of the warning when it is judged that the remaining size of the spare storage area is smaller than the predetermined value.

Moreover, it may be further modified such that a warning indication signal is provided for transmission to an external system and when the spare area checking unit judges that the remaining size of the spare storage area is smaller than the predetermined value, the warning indication signal is changed in level to notify the external system of the warning.

By this arrangement, it is decided whether or not a warning be raised only when the external system requests for the examination of the remaining size, and accordingly, the warning can effectively be notified to the system.

The semiconductor storage device may further comprise an external switch wherein the spare area size calculating unit executes the calculation of the remaining size of the spare storage area when the external switch is turned on. As a result, the semiconductor storage device such as a semiconductor card can check the end of its life independently of the external system without giving any load to the external system.

A fourth aspect of the present invention provides a semiconductor storage device equipped with flash memories each having a limited number of rewriting operations to be subjected and each flash memory being provided with a spare storage area for replacing a defective portion caused in a data writing operation, where the semiconductor storage device comprises: an error decision unit for judging whether or not an error occurs in a defective portion during a data writing operation; a replacing unit for replacing the defective portion by the spare storage area to write the data when the error decision unit judges that an error occurs; a command receiving unit for receiving a remaining number examination command from an external equipment requesting an examination of a remaining size of the spare storage area; a remaining spare size calculating unit for calculating a remaining size in number of the spare storage area in response to the remaining number examination command after the data has been written to the spare storage area; and a spare area checking unit for comparing the calculated remaining size of the spare storage area with a predetermined value.

This allows the remaining number of the spare sectors to be monitored. The time for replacement with a new device can thus be acknowledged before any write error occurs due to the exhaustion of the spare sectors.

In this fourth aspect, entry and response procedure of the remaining number examination command may be based on a non-data transfer command protocol.

Moreover, it may be modified such that, in response to the remaining number examination command, the remaining spare size calculating unit obtains the minimum of count numbers of good sectors existing in the spare storage areas of the entire flash memories and determines the minimum as the remaining number of the spare sectors of the semiconductor storage device and when the remaining number of the spare sectors is smaller than the predetermined value, the remaining number of the spare sectors is notified to the external equipment. Thus, the external host equipment can readily be notified of the remaining number of the spare sectors of the semiconductor storage device.

Moreover, it may further be modified in which in response to the remaining number examination command, a particular code indicative of a consumption condition of the spare sectors is delivered. This allows the external host to readily judge whether or not the semiconductor storage device needs to be replaced with a new one through merely checking the returned value of each sector count register after the execution of the command.

BRIEF DESCRIPTION OF THE DRAWINGS

These and other objects and features of the present invention will be readily understood from the following detailed description taken in conjunction with preferred embodiments thereof with reference to the accompanying drawings, in which:

FIG. 12 is a diagram showing parameters of each register before and after execution of a count replace sector command and description thereof; and FIG. 13 is a diagram showing parameters of each register before and after execution of a check replace condition command.

DETAILED DESCRIPTION OF THE PREFERRED EMBODIMENTS

Preferred embodiments of the present invention will be described referring to the accompanying drawings. It is noted that, throughout the drawings, like components are denoted by like numerals and their explanation will not be repeated.

Figure 1:
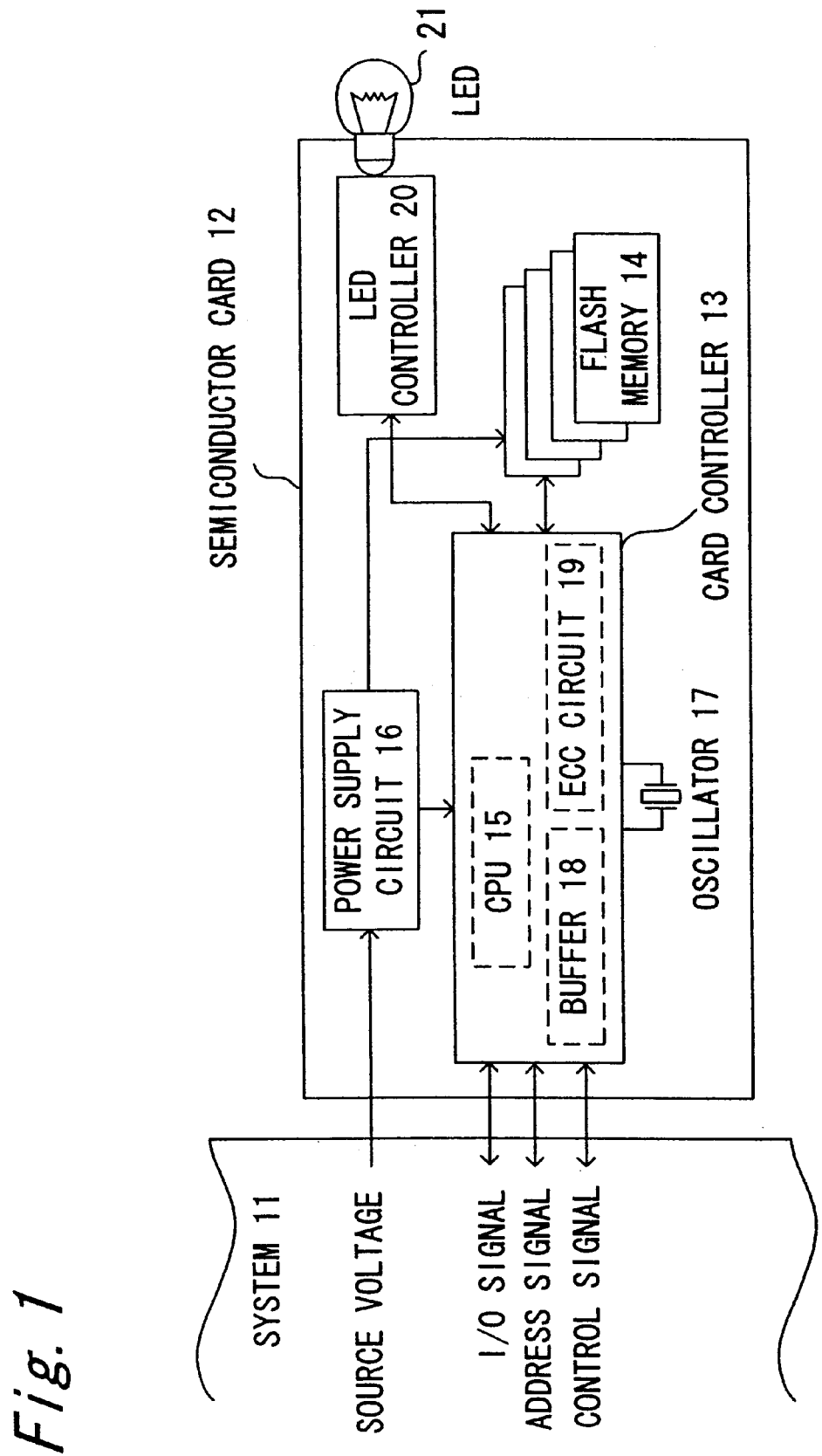
FIG. 1 is a block diagram showing an arrangement of a warning generating system of a semiconductor card according to the present invention.

FIG. 1 is a block diagram of a basic arrangement of a data writing and reading system using a semiconductor card as a semiconductor storage device according to the present invention. As shown in the figure, the semiconductor card 12 comprises a card controller 13, flash memories 14, and a power supply circuit 16. The card controller 13 includes a microprocessor (referred to as "CPU") 15, a buffer portion 18, and an error correction coding circuit (ECC) 19. The card controller 13 is connected with an oscillator 17. The card controller 13 exchanges with an external system 11 various data signals including I/O signals, address signals, and control signals. The semiconductor card 12 also includes a warning generator (LED) 21 which is controlled by an LED controller 20 for generating a warning or alarm signal.

The operation of the card controller 13 is fundamentally controlled by commands from the CPU 15 built in the card controller 13. The operation of writing and reading of data with respect to the flash memories 14 is carried out through data transfer using the buffer portion 18 built in the card controller 13. The buffer portion 18 includes a plurality of buffers having different sizes corresponding to types of data read out of the flash memories such as management data internally needed by the memory card and external data from the system.

Figure 2:
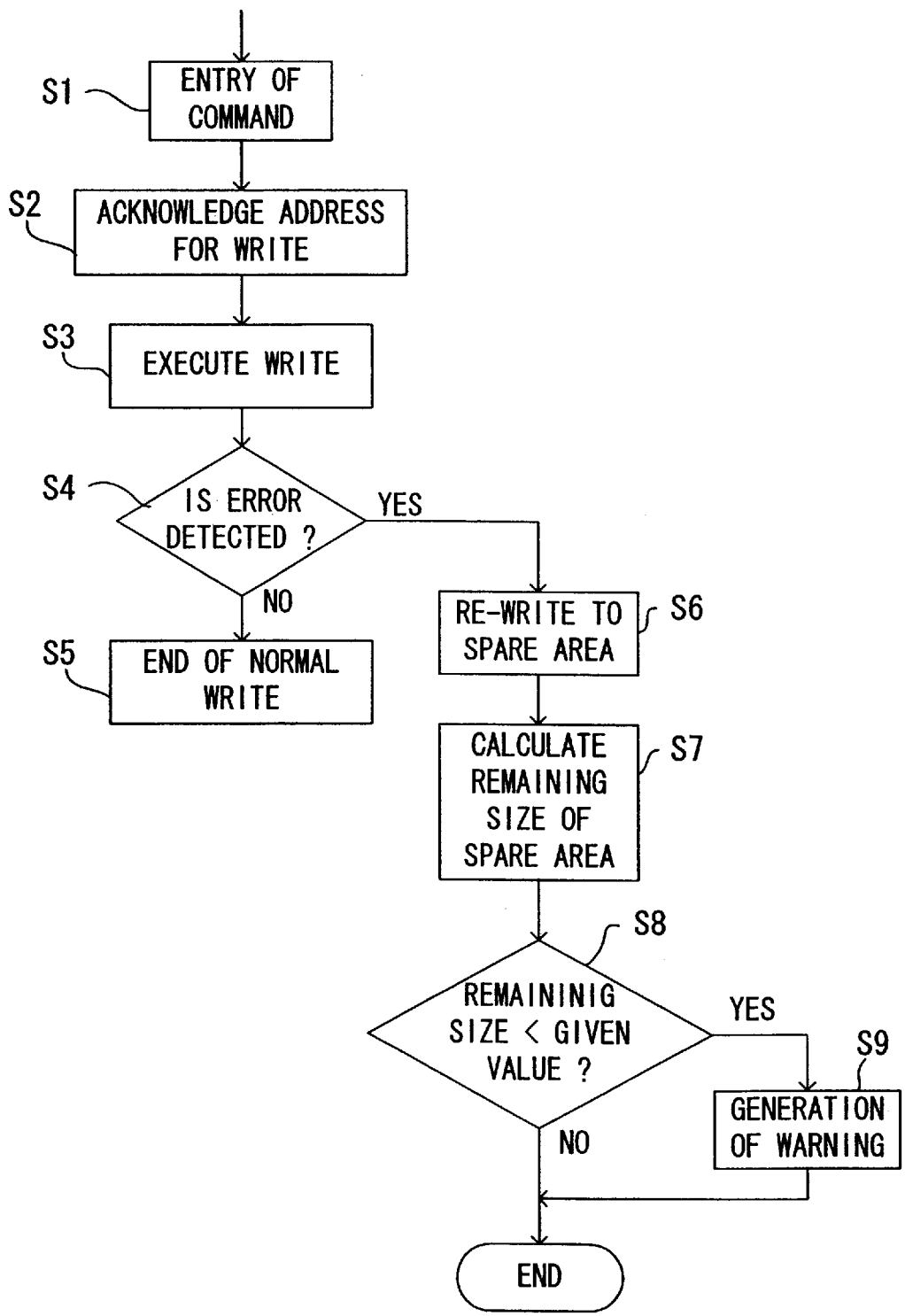
FIG. 2 is a flowchart showing an operation of the semiconductor card according to the present invention.

FIG. 2 is a flowchart showing a procedure of generating a warning in a data writing operation of the semiconductor card according to the present invention. As shown in the figure, when a command for data writing is issued from the external system 11 and is received by the buffer 18 for writing data into a flash memory in the semiconductor card in Step S1, the address of the subject data in the flash memory is obtained in Step S2 and the writing operation of the data is commenced in Step S3. It is then examined in Step S4 whether or not an error (or a fault) occurs during the writing operation. When no error (or fault) is detected, the writing operation is successfully carried out in Step S5.

If any error (fault) is detected, a re-writing operation of the data into a spare storage area is executed in Step S6. After re-writing the data, the remaining size in capacity of the spare storage area is calculated in Step S7. The remaining size is then compared with a predetermined threshold value in Step S8. When the remaining size is smaller than the predetermined value (YES in Step S8), a warning is generated by the warning generator (21) provided in the semiconductor card in Step S9.

Accordingly, when an error occurs during the writing of data with respect to the flash memory in the semiconductor card, the spare storage area is used in sector or block units for transferring the data, and then the remaining size of the spare storage area is examined. When the remaining size is smaller than the predetermined value, the warning generator in the semiconductor card generates a warning signal. This allows the user of the semiconductor card to be timely informed that the life of the flash memory is close to its limit.

Embodiment 1

This embodiment describes an operation of writing data into a flash memory in the semiconductor card in response to a data write command sent from the external system 11 and carrying out a counter-action when a write error on the flash memory occurs or when the card controller detects a generation of a write error, which will be described below referring to FIGS. 1 and 2.

When the power supply circuit 16 is turned on, the card controller 13 acknowledges a message of the command supplied from the external system 11 and starts various controlling actions for execution of the command. The writing of data into the flash memories 14 is implemented through data transfer using the buffer portion 18 which serves as an intermediate provided in the card controller 13.

Figure 3:
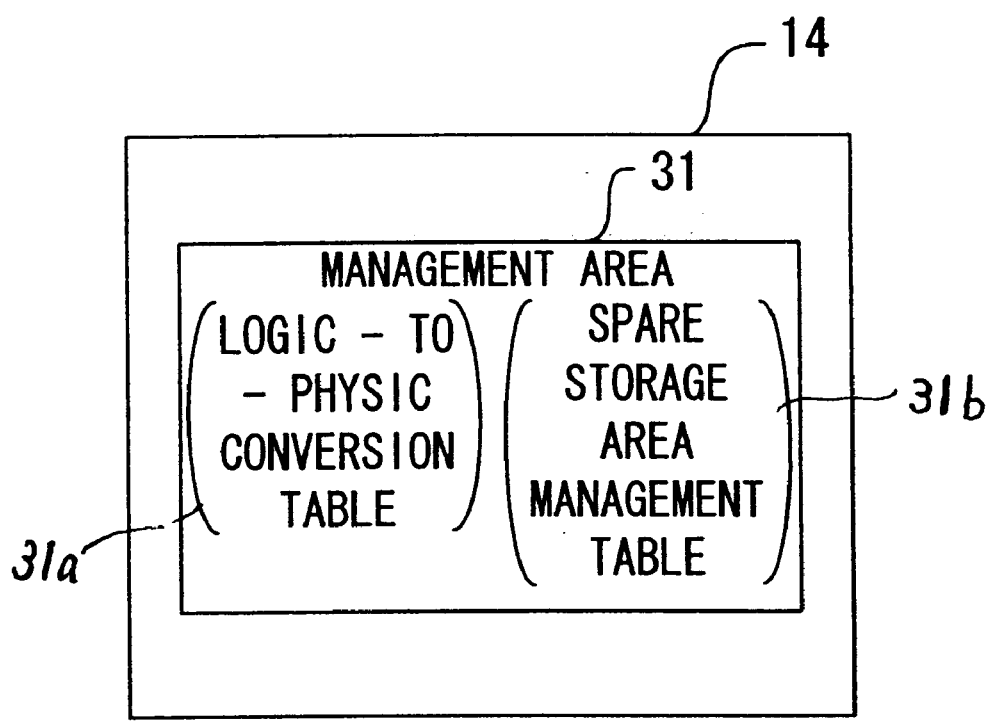
FIG. 3 is a schematic model view showing a structure of a management area in the semiconductor card according to the present invention.

An example of a procedure including processes of generating an error and giving a warning will now be explained in the case where the warning is generated when the external system 11 requests an action of data writing. In response to a command for data writing sent from the external system 11, the card controller 13 accepts the command for writing the data when the subject data is determined to be writable by judging the address of the data. While the data to be written sent from the system 11 is received and saved in the buffer portion 18, a logic-to-physic conversion table 31a is retrieved from a management area 31 in the flash memory 14 as shown in FIG. 3. Then, a logic address in the flash memory 14 to which the data is written is confirmed based on the logic address data contained in the command issued by the system 11.

The management area 31 is a specific storage area where the external system 11 is not allowed to read/write data from/to the management storage area. The management area holds various control data such as firm wares and conversion tables required for controlling the internal actions of the semiconductor card 12. The conversion tables include not only a logic-to-physic conversion table 31a but also a spare storage area management table 31b for managing the start address and end address of the spare storage area, as shown in FIG. 3. When the power supply circuit 16 is turned on, the data in the management area of the flash memory 14 is downloaded to a RAM region in the card controller 13. The contents of the downloaded data may be rewritten or overwritten to the flash memories 14 and may be updated when necessary.

When the buffer portion 18 has completely received the data sent from the external system 11, the action of data writing into the flash memory 14 is executed (see S3 in FIG. 2). The writing of the data into the flash memory 14 is performed by execution of the data write command, and the data writing operation per se is left to the flash memory 14.

When the card controller 13 judges that an error occurs in the flash memory 14 such as time over of the writing action during the writing of the data into the flash memory 14, the start address of the spare storage area is obtained from the spare storage area management table 31b of the management area 31. Then the data saved in the buffer portion 18 is re-written to the obtained address of the spare storage area (see S6 in FIG. 2).

When the re-writing of the data into the spare storage area has been correctly finished, both the logic-to-physic conversion table and the spare storage area management table in the management area 31 are updated. After updating the tables, the remaining size of the spare storage area is calculated to be examined (see S7 in FIG. 2). When the remaining size is smaller than the predetermined value (YES in Step S8), the card controller 13 instructs the LED controller 20 to emit the light warning generator LED 21 for notifying the user of a warning.

Although the explanation is made in the case where the data to be written in the flash memory 14 is received from the external system 11, the data may be derived from the management area without transferring data from the system 11. In such a case, a warning can be raised when the remaining size of the spare storage area is judged smaller than the predetermined value after the management data is written into the spare storage area.

In this embodiment, when an error occurs during the writing of the data into the flash memories 14 in the semiconductor card, the remaining size of the spare storage area is examined after the data is written into the spare storage area, and when the remaining size is smaller than the predetermined value, the LED controller 20 and the LED 21 in the semiconductor card 12 are actuated to generate a warning signal of illumination, thus allowing the user of the semiconductor card 12 to be timely notified of the warning.

Figure 4:
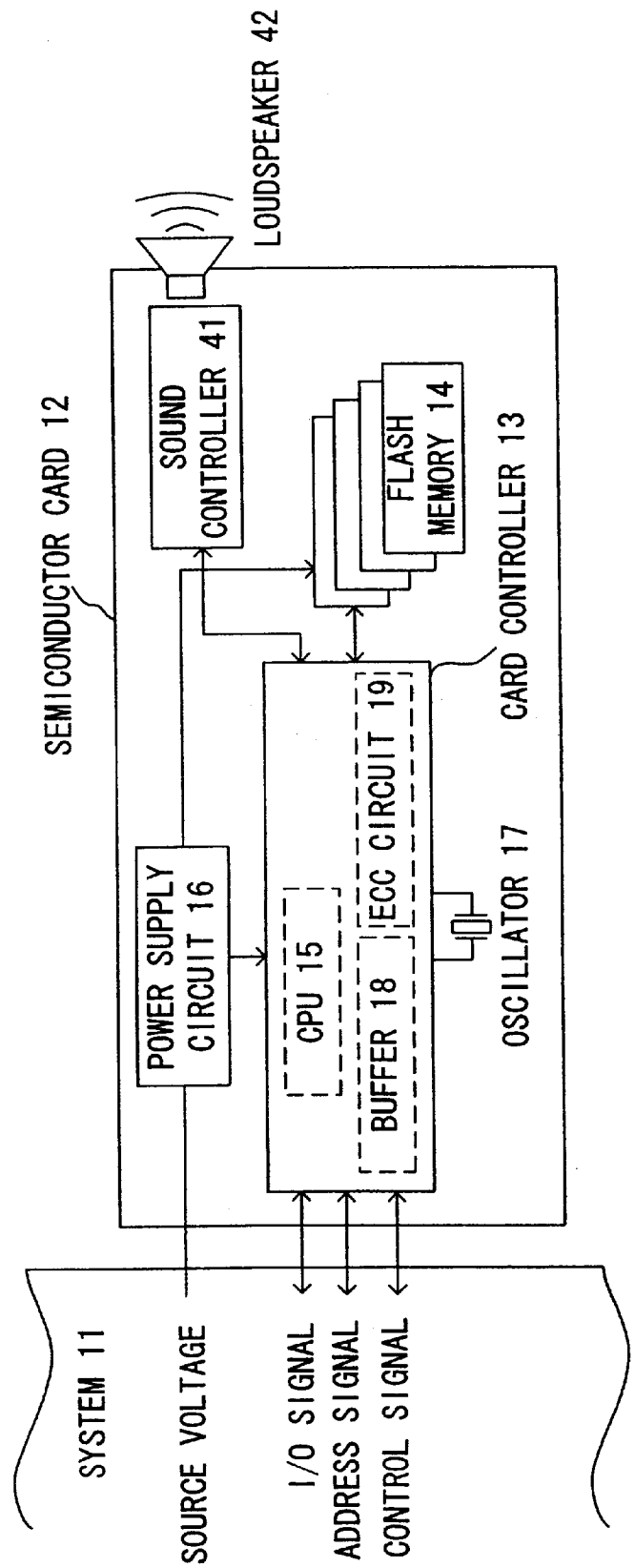
FIG. 4 is a block diagram showing another arrangement of a warning generating system of the semiconductor card according to the present invention.

Although the warning signal is implemented by illumination of the LED 21 driven by the LED controller 20 in this embodiment, the LED illumination of the warning signal may be replaced by a sound generation through combination of a loudspeaker 42 and a sound controller 41 as shown in FIG. 4.

Embodiment 2

In this embodiment, the process shown by the step S7 in FIG. 2 of examining the remaining size of the spare storage area is implemented by a relevant command in the warning generating procedure where the relevant command, if needed, is sent from the external system 11.

The procedure of generating a warning signal is explained by steps as below. When a check command is issued by the external system 11 for examining the remaining size of the spare storage area, the card controller 13 calculates the remaining size by examining the spare storage area management table 31b of the management area 31 which manages the start and end addresses of the spare storage area (see S7 in FIG. 2). When it is judged that the remaining size is small enough to generate a warning or alarm signal (see S8 in FIG. 2), the LED 21 or the loudspeaker 42 is actuated to give the warning or alarm signal to the user.

In this embodiment, it is determined whether or not a warning signal is raised only when a check command for examining the remaining size of the spare storage area is received from the external system 11. Thus, the user is allowed to be effectively notified of the warning. Details of the check command for examining the remaining size of the spare storage area will be explained later in Embodiments 5 and 6, referring to FIGS. 12 and 13.

Embodiment 3

In this embodiment, the process shown in Step S9 in FIG. 2 of generating a warning signal is implemented by reading a specific bit flagged in a register 43 which is provided in the card controller 13 and accessible from the external system 11. Then, the warning signal is given to the external system 11 and the user.

Figure 5:
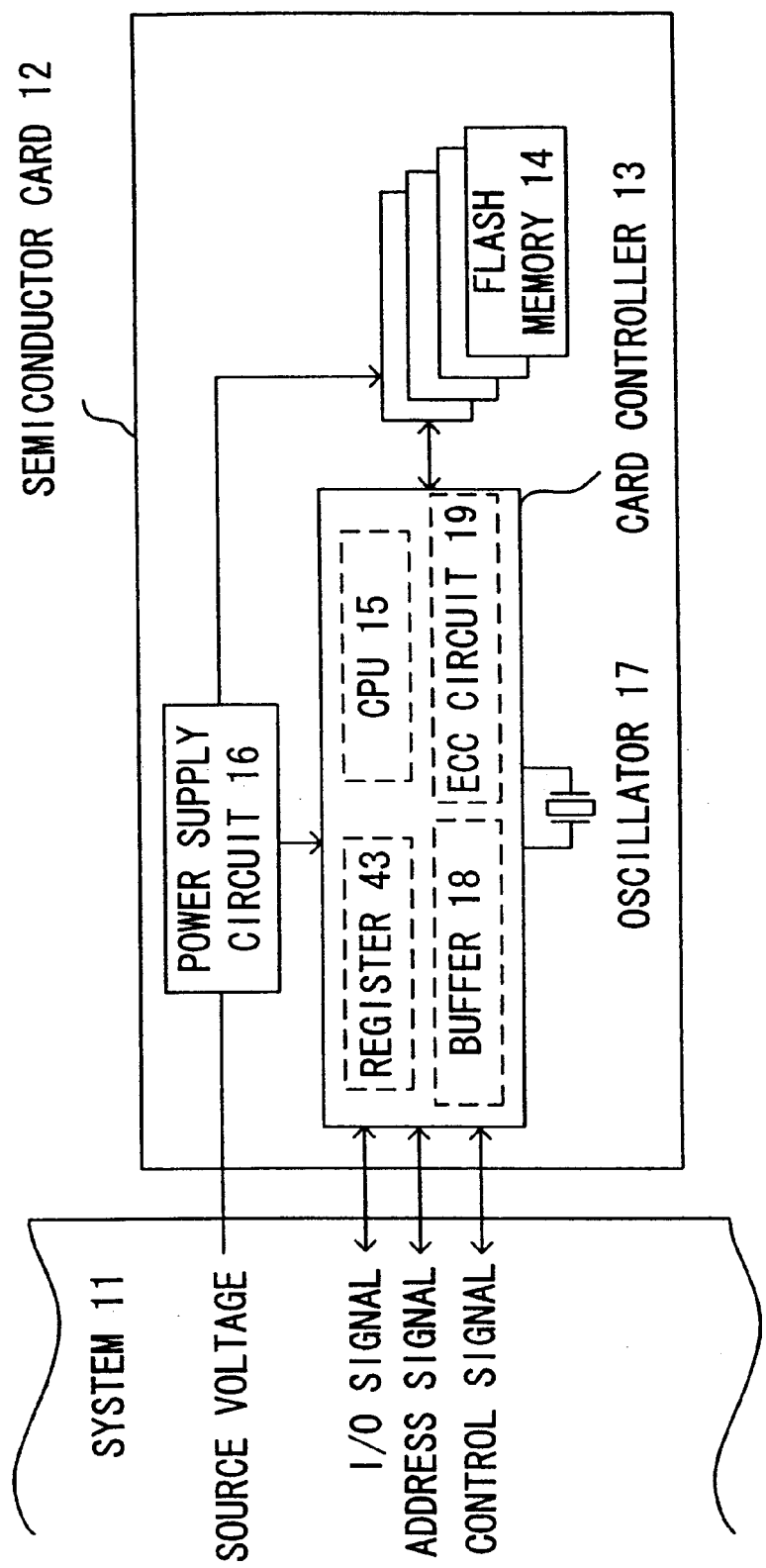
FIG. 5 is a block diagram showing a further arrangement of a warning generating system of the semiconductor card according to the present invention.

FIG. 5 is a block diagram showing an arrangement of this embodiment. The operation of this embodiment will be described referring to FIG. 5. When a check command is sent from the external system 11 for examining the remaining size of the spare storage area, the remaining size is calculated by reading the spare storage area management table 31b of the management area 31 which manages the start and end addresses of the spare storage area (see S7 in FIG. 2). When the remaining size is small enough to raise a warning signal (see S8 in FIG. 2), a specific bit is flagged in the register 43 which is accessible from the external system 11. The flagged specific bit is then read by the external system 11 so that the system 11 in turn is notified of the warning.

Figure 6:
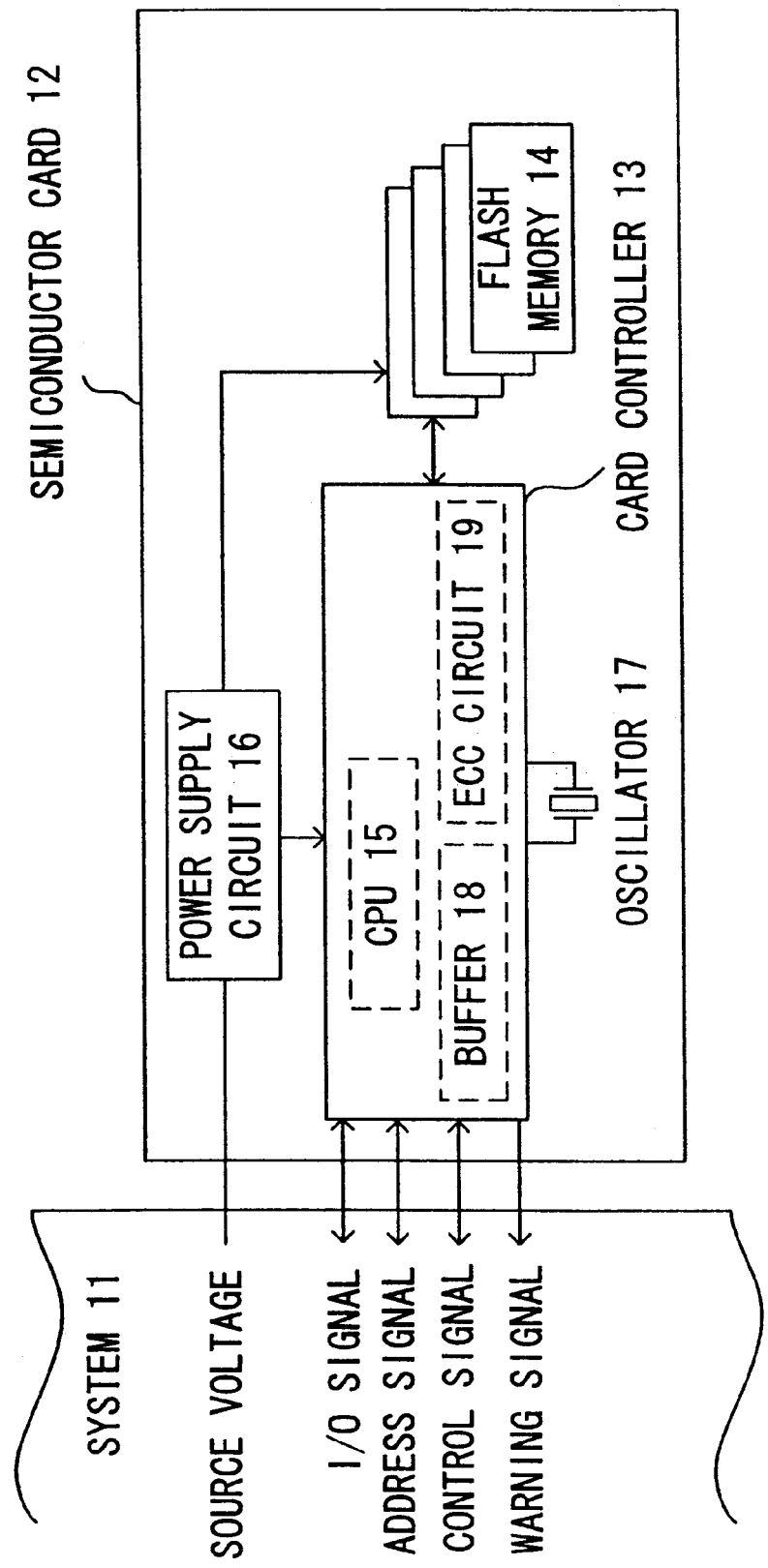
FIG. 6 is a block diagram showing a still further arrangement of a warning generating system of the semiconductor card according to the present invention.

A modification of this embodiment is shown in FIG. 6 where a warning indication signal is transmitted from the card controller 13 to the external system 11 instead of providing the register 43. For example, when the warning indication signal is turned to a high (H) level, the external system 11 acknowledges that the warning is sent from the semiconductor card 12.

In this embodiment, it is determined whether or not the warning is raised only when a relevant check command is issued by the external system 11. Thus, the warning can be effectively given to the external system 11.

Embodiment 4

In this embodiment, the step of examining the remaining size of the spare storage area is implemented by means of a switch 71 provided outside the semiconductor card 12 so that a warning signal can be raised when needed.

Figure 7:
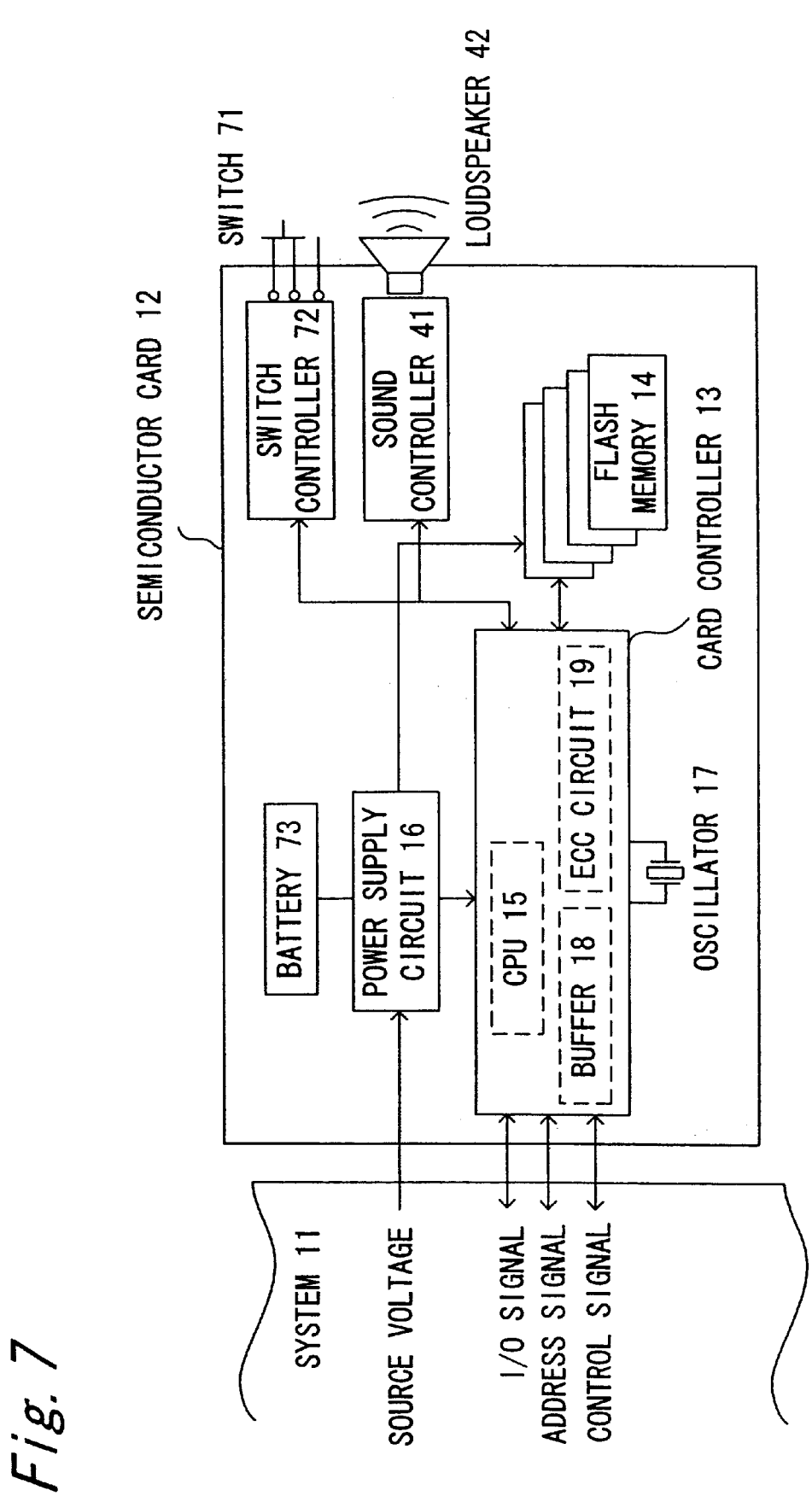
FIG. 7 is a block diagram showing a still further arrangement of a warning generating system of the semiconductor card according to the present invention.
Figure 8:
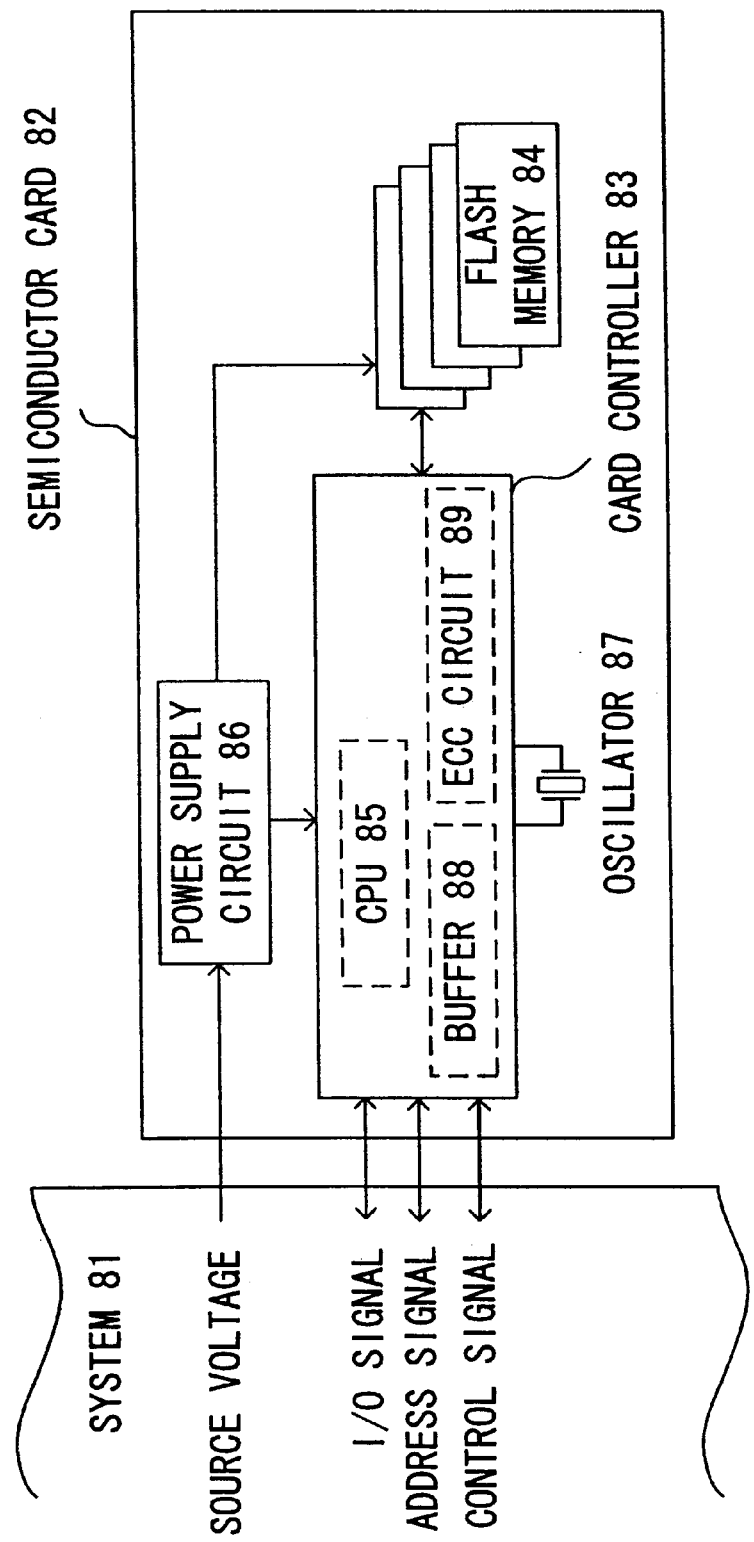
FIG. 8 is a block diagram showing a construction of a conventional semiconductor card.

FIG. 7 is a block diagram showing an arrangement of this embodiment. As shown in the figure, the semiconductor card 12 includes a switch controller 72 for controlling the external switch 71 and a built-in battery 73 for independent power supply.

The operation of this embodiment will be described by steps, concentrating to the procedure of raising a warning or alarm. When the switch 71 is turned on, the remaining size of the spare storage area is calculated by reading the spare storage area management table 31b of the management area 31 which manages the start and end addresses of the spare storage area (see S7 in FIG. 2). When the remaining size is small enough to generate a warning signal (see S8 in FIG. 2), the LED 21 or the loudspeaker 42 is actuated to raise a warning or alarm.

In this embodiment, the life of the semiconductor card can be examined independently of the action of the external system 11, and thus no load is given to the system 11 during the check of the life of the semiconductor card. Also, even in the case where the external system 11 feeds no power voltage to the semiconductor card 12 in a non-access mode, the semiconductor card 12 can be energized by the built-in battery 73 for conducting process for generating the warning.

Embodiment 5

This embodiment will be described below with reference to FIGS. 9 to 12. In this embodiment, a semiconductor storage device (or flash storage device) is equipped with a flash memory portion for replacing error sectors in rewriting by spare sectors. The semiconductor storage device employs a specific command for examining the remaining number of spare sectors in order to notify a host computer or a like external equipment of the fact that the spare sectors provided for replacing the error sectors are reduced in remaining of the storage area.

Figure 9:
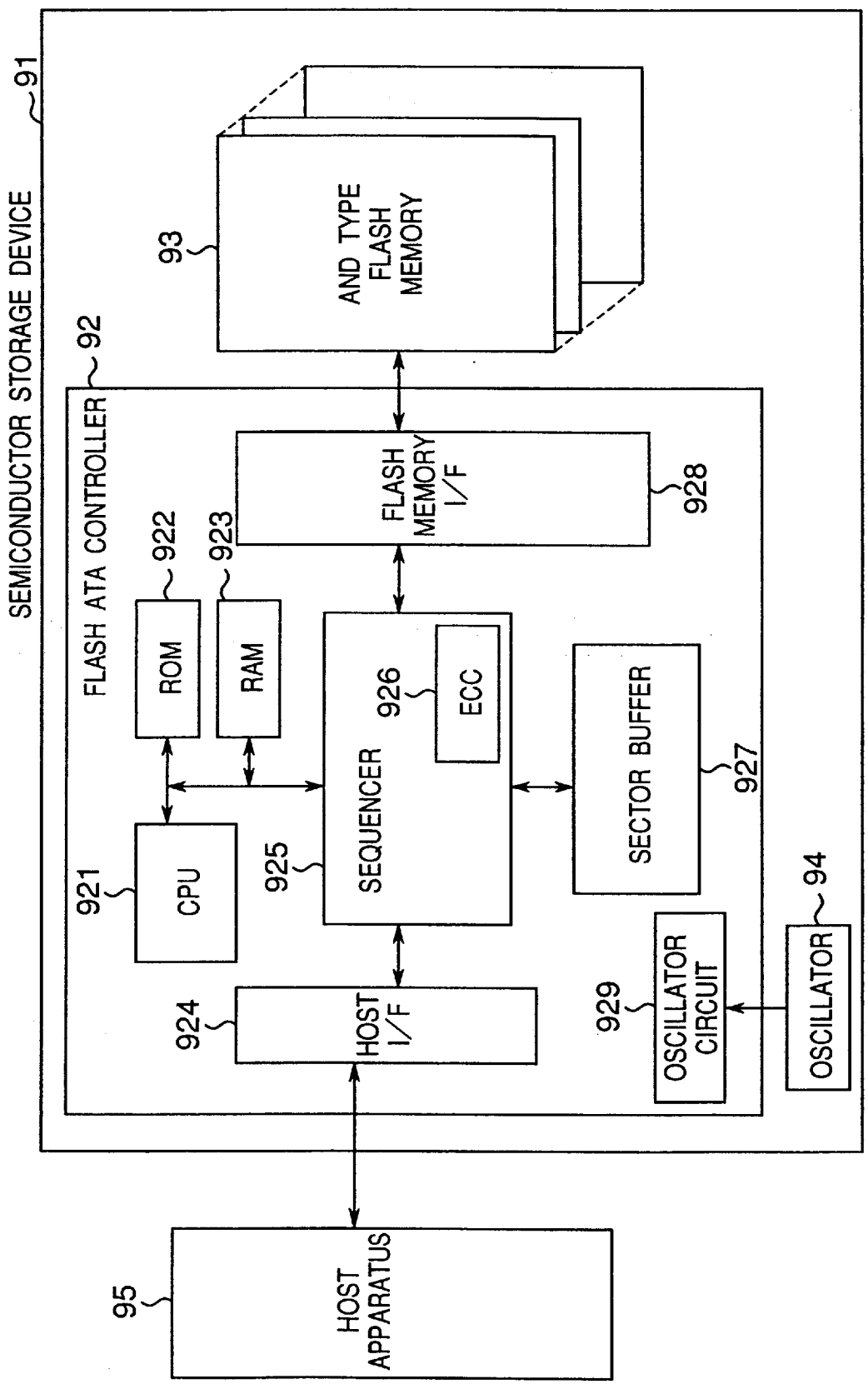
FIG. 9 is a block diagram showing an arrangement of a semiconductor storage device according to the present invention.

FIG. 9 is a block diagram showing a fundamental construction for implementing internal functions of the semiconductor storage device according to Embodiment 5 of the present invention. The semiconductor storage device of this embodiment includes 256 Mb AND type flash memories as a storage flash memories and an ATA interface (I/F).

As shown in FIG. 9, the semiconductor storage device 91 comprises a flash ATA controller 92, AND type flash memories 93, and an oscillator 94 and can be operated while being linked with a host equipment 95. The flash ATA controller 92 comprises a CPU 921, a ROM 922 where command codes for the CPU 921 are stored, a RAM 923 used as an operating area, a host I/F circuit 924 for providing an interface (I/F) with the host equipment 95, a sequencer 925 for controlling internal data transfer and timing of actions responsive to the commands from the CPU 921, a sector buffer 927, a flash I/F circuit 928, and an oscillator circuit 929. The sequencer 925 includes an error correction coding/decoding (ECC) circuit 926. The oscillator circuit 929 is connected to the oscillator 94 to generate clock signals for timing of the operations of the CPU 921 and the sequencer 925.

In this embodiment, the semiconductor storage device 91 operates based on an ATA specified protocol which is widely used as an I/F protocol for an external storage device of personal computers.

Figure 10:
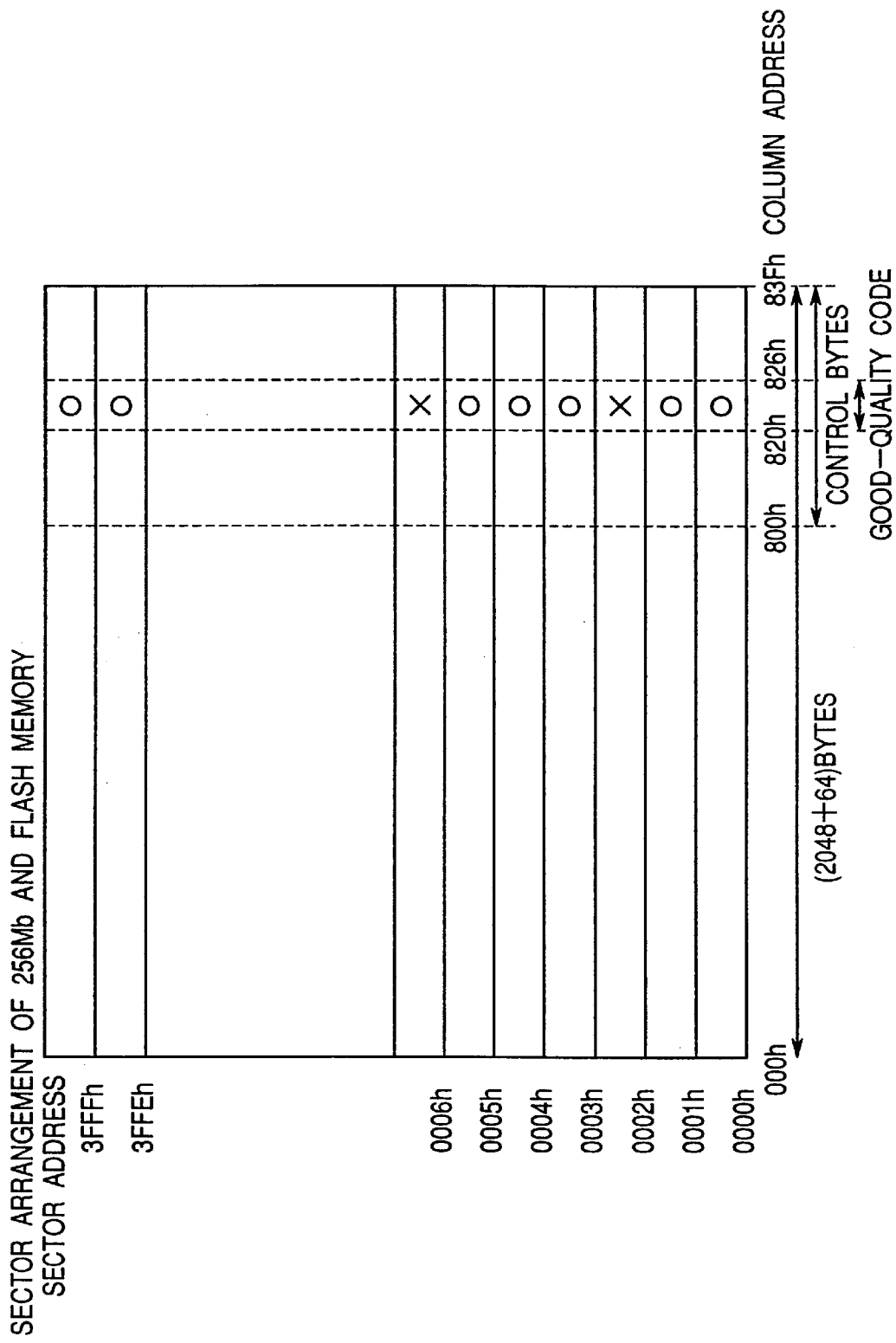
FIG. 10 is a schematic model view showing a sector arrangement of an AND type flash memory used in the semiconductor storage device according to the present invention.

FIG. 10 illustrates a sector construction of the 256 Mb AND type flash memory (M5M29F25611VP) employed in this embodiment. The AND type flash memory is comprised of 16384 physical sectors, each having a size of (2048+64) bytes. Through specifying a sector address and column address, the read/write/delete operation for each sector can be conducted. In this embodiment, a mostly good memory (MGM) is used as an example of the AND type flash memory where primary defects in sectors are tolerable at most 2% of the entire sectors. Each sector can be judged for availability by reading good-quality codes saved in a column address range extending from 820 H to 825 H.

Figure 11:
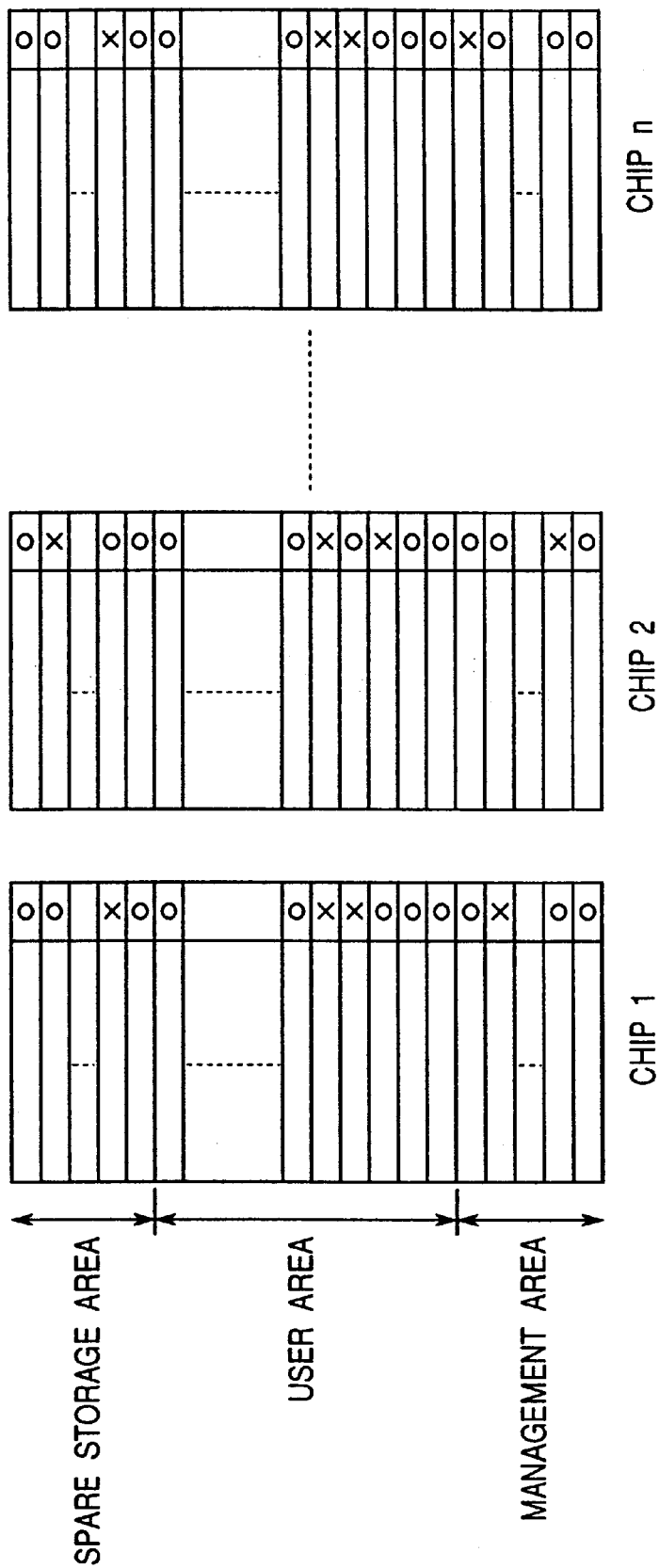
FIG. 11 is a schematic model view showing sector conditions in an AND type flash memory used in the semiconductor storage device according to the present invention.

FIG. 11 illustrates an example of the judgement conditions indicating whether each sector is in a good or error (not-good) state in the 256 Mb AND type flash memories which are denoted by "Chips 1 to n" provided in the semiconductor storage device. Each of the flash memories (Chips 1 to n) has segmented sector groups of a management area, user area and spare storage area. The management area comprises the starting several sectors where the logic-to-physic conversion table is stored indicative of a distribution of good sectors in each flash memory. The user area stores user data to be written and read. The spare storage area is used as the spare sectors which are provide for replacement of error sectors produced during the re-writing of user sectors.

In each flash memory, the start addresses of the user area and spare storage area are stored in the management area. In this arrangement, each sector stores a flag data indicating the attribute of the sector at a position defined by the control bytes of the sector as shown in FIG. 10. The flag data is read out and examined by the CPU 921 to determine whether the sector belongs to the management area, user data area or spare storage area.

In the semiconductor storage device of this embodiment, an ATA specified non-data transfer command protocol is employed to implement the function of counting the remaining number of good sectors available as the spare sectors in the spare storage area. More specifically, when receiving a command for counting the remaining number of spare sectors (or command for counting sectors for replacement), the CPU 921 starts counting the number of available spare sectors in each flash memory.

FIG. 12 illustrates parameters of each register before and after execution of the command for counting replace sectors and their description. The execution of the command for counting the remaining number of spare sectors involves the steps of setting the drive number (DRV) of a relevant drive (device) to a Drive bit in a Drive/Head Register and thereafter writing a command code (F0h) into the Command Register.

When the command is written to the Command Register, the drive (device) sets a busy bit (BST) in the Status Register.

Then, the CPU 921 counts the number of good sectors in the spare storage area in each flash memory, obtaining the minimum value of the count numbers in the flash memories as the remaining number of spare sectors (RepSecCount) set to the Sector Count Register, and clearing the busy bit (BSY) to zero and generating an interruption. When 255 or more of the spare sectors remain, the Sector Count Register is set with FFh (RepSecCount=FFh). Thus, the host equipment is allowed to judge that the drive holds a sufficient number of spare sectors.

If the number of the remaining spare sectors is smaller than 255, the same number thereof may be set in a hexadecimal notation to the Sector Count Register and the host equipment can thus acknowledge the number of the remaining spare sectors of the drive.

The host equipment can monitor the number of spare sectors in each drive by periodically implementing the above commend. Accordingly, the host equipment can acknowledge the time for replacing the drive with a new one, so that generation of a write error derived from the exhaustion of the spare sectors can be effectively avoided in the drive.

Embodiment 6

Embodiment 6 of the present invention will be described below with reference to FIG. 13. FIG. 13 illustrates measurements in each register before and after implementing Check Replace Condition command for examining the conditions of spare sectors. In this embodiment, as shown in FIG. 13, in response to a request from the host equipment after implementing Check Replace Condition command, the drive expresses the spare sector consumption condition, for example, in three levels; 00h, 0Fh, and FFh according to the remaining number of the spare sectors, instead of setting the remaining number of spare sectors (RepCode) directly to the Sector Count Register.

More particularly, when the count replace sector command is received, the remaining numbers of spare sectors in the flash memories are calculated and the minimum value thereof is obtained. The minimum value is then examined whether or not it is smaller than the predetermined value. A result of the examination is transferred back to the host equipment as a reply indicative of the spare sector consumption condition of the semiconductor storage device. For example, when the spare sectors remain 50% or more of their original number, 00h is set as the RepCode to the Sector Count Register. When smaller than 50% but not smaller than 10%, 0Fh is set, and when smaller than 10%, FFh is set.

This allows the host equipment to judge whether or not the drive is needed to be replaced with a new one through checking whether or not the set value in the Sector Count Register is FFh after implementing the count replace sector commend.

As set forth above, the semiconductor card equipped with the flash memories of the present invention can check the remaining size of spare storage area to acknowledge that the life of each flash memory comes close to its limit before the flash memory is completely used up, thus preventing any malfunction derived from the end of the life and improving the operational reliability.

The semiconductor storage device of the present invention employs the command for examining the consumption of spare sectors (blocks) and when receiving the command from the host equipment, notifies the host equipment of the consumption of the spare sectors so that the host equipment can acknowledge the fact that the remaining number of spare sectors comes close to its end. Accordingly, the host equipment can readily be advised the time of replacement of the device with a new one before the device generates a misconduct such as an error action in the system.

Although the present invention has been described in connection with the preferred embodiments thereof with reference to the accompanying drawings, it is to be noted that various changes and modifications will be apparent to those skilled in the art. Such changes and modifications are to be understood as included within the scope of the present invention as defined by the appended claims, unless they depart therefrom.

What is claimed is:

1. A semiconductor storage device equipped with flash memories each having a limited size of a spare storage area, said semiconductor storage device comprising:
    an error decision unit for judging whether or not an error occurs during writing of data;
    a replacing unit for rewriting data to the spare storage area when said error decision unit judges that an error occurs;
    a spare area size calculating unit for calculating a remaining size of the spare storage area after the data has been re-written to the spare storage area;
    a spare area checking unit for comparing the remaining size of the spare storage area with a predetermined value; and
    a warning generator for generating a warning when the remaining size of the spare storage area is smaller than the predetermined value.

2. The semiconductor storage device according to claim 1, wherein the replacing unit acquires a start address of the spare storage area from a spare storage area management table which is saved in a management area of each flash memory to thereby rewrite the data to the spare storage area of the acquired address, and after the completion of the data rewriting, the replacing unit updates the spare storage area management table and a logic-to-physic conversion table saved in the management area.

3. The semiconductor storage device according to claim 1, wherein the spare area size calculating unit calculates the remaining size of the spare storage area in response to a check command for checking the remaining size of the spare storage area which is issued by an external system.

4. The semiconductor storage device according to claim 1, further comprising a register for flagging a specific bit indicative of the warning when it is judged that the remaining size of the spare storage area is smaller than the predetermined value.

5. The semiconductor storage device according to claim 1, wherein a warning indication signal is provided for transmission to an external system and when the spare area checking unit judges that the remaining size of the spare storage area is smaller than the predetermined value, the warning indication signal is changed in level to notify the external system of the warning.

6. The semiconductor storage device according to claim 1 further comprising an external switch wherein the spare area size calculating unit executes the calculation of the remaining size of the spare storage area when the external switch is turned on.

7. A warning generating system of a semiconductor storage device exchanging commands and data with an external system, the semiconductor storage device being equipped with flash memories each having a limited size of a spare storage area, said system comprising:
    an error decision unit for judging whether or not an error occurs during writing of data;
    a replacing unit for rewriting data to the spare storage area when said error decision unit judges that an error occurs;
    a spare area size calculating unit for calculating a remaining size of the spare storage area after the data has been re-written to the spare storage area;
    a spare area checking unit for comparing the remaining size of the spare storage area with a predetermined value; and
    a warning generator for generating a warning when the remaining size of the spare storage area is smaller than the predetermined value.

8. A warning generating method of a semiconductor storage device equipped with flash memories each having a limited size of a spare storage area, the method comprising:

judging whether or not an error occurs during writing of data;

rewriting data to the spare storage area when it is judged that an error occurs;

calculating a remaining size of the spare storage area after the data has been re-written to the spare storage area;

comparing the remaining size of the spare storage area with a predetermined value; and generating a warning when the remaining size of the spare storage area is smaller than the predetermined value.

9. A semiconductor storage device equipped with flash memories each having a limited number of rewriting operations to be subjected and each flash memory being provided with a spare storage area for replacing a defective portion caused in writing data, said semiconductor storage device comprising:

an error decision unit for judging whether or not an error occurs in a defective portion during a data writing operation;

a replacing unit for replacing the defective portion by the spare storage area to write the data when the error decision unit judges that an error occurs;

a command receiving unit for receiving a remaining number examination command from an external equipment requesting an examination of a remaining size of the spare storage area;

a remaining spare size calculating unit for calculating a remaining size in number of the spare storage area in response to the remaining number examination command after the data has been written to the spare storage area; and a spare area checking unit for comparing the calculated remaining size of the spare storage area with a predetermined value.

10. The semiconductor storage device according to claim 9, wherein each of the flash memories a sector arrangement in which data is rewritable in sector units and each flash memory includes a management area (31) for saving a logic-to-physic conversion table which indicates a distribution of good sectors of each flash memory, a user area for saving user data, and a spare storage area having spare sectors which replace defective sectors, and wherein the start addresses of the user area and the spare storage area are written in the management area, and wherein a flag data indicative of an attribute of each sector is saved in a specified byte position in each sector.

11. The semiconductor storage device according to claim 9, wherein entry and response procedure of the remaining number examination command is based on a non-data transfer command protocol.

12. The semiconductor storage device according to claim 9, wherein, in response to the remaining number examination command, the remaining spare size calculating unit obtains the minimum of count numbers of good sectors existing in the spare storage areas of the entire flash memories and determines the minimum as the remaining number of the spare sectors of the semiconductor storage device and when the remaining number of the spare sectors is smaller than the predetermined value, the remaining number of the spare sectors is notified to the external equipment.

13. The semiconductor storage device according to claim 9, wherein, in response to the remaining number examination command, a particular code indicative of a consumption condition of the spare sectors is delivered.

* * * * *